United States Patent [19]

Cutler

[11] Patent Number: 4,906,875
[45] Date of Patent: Mar. 6, 1990

[54] DIGITAL INTEGTRATING MIXER

[75] Inventor: Gregory M. Cutler, Cupertino, Calif.

[73] Assignee: Hewlett-Packard Company, Palo Alto, Calif.

[21] Appl. No.: 191,930

[22] Filed: May 9, 1988

[51] Int. Cl.[4] .......................... G06G 7/00; H03L 7/00
[52] U.S. Cl. ..................................... 307/529; 307/271; 328/139; 328/156; 328/160; 377/47
[58] Field of Search ................... 329/50, 101; 307/529, 307/219.1, 271; 328/156, 160, 139; 377/47

[56] References Cited

U.S. PATENT DOCUMENTS

| | | | |
|---|---|---|---|
| 3,551,826 | 12/1970 | Sepe | 328/160 |
| 4,059,806 | 11/1977 | Vagt, Jr. | 329/50 |
| 4,242,634 | 12/1980 | Metcalf | 328/160 |
| 4,585,998 | 4/1986 | Veillard | 329/50 |

Primary Examiner—Stanley D. Miller
Assistant Examiner—Richard Roseen
Attorney, Agent, or Firm—William H. F. Howard

[57] ABSTRACT

A digital integrating mixer is described including a bandpass filter for filtering an input signal, a comparator for comparing the filtered signal to a reference signal to provide an output which may be of one of two values. A cascaded string of D flip-flops samples the comparator output at predetermined times to provide a first and second type of sample. The time interval between any two samples of the same type is an integral multiple of the cycles of the input signal. The time interval between any two samples of different types is different from an integral multiple of a cycle of the input signal. The mixer also includes a counter which counts up when the sample is of the first value and counts down when the sample is of the second value, when the sample is of the first type, and counts in the opposite direction when the sample is of the second type. If the string of D flip-flops samples approximately an equal number of the first and second types of samples, DC offset in the mixer is reduced. In addition a two channel digital integrating mixer with an analogous structure is disclosed. In the two channel mixer, the string of D flip-flops may also be used to sample the comparator output at predetermined times to provide four types of samples where the time interval between any two samples of the same type is an integral multiple of a cycle of the input signal. The time interval between any first type of sample and any second type of sample is different from an integral multiple of a cycle of the input signal; the same is true between the third and fourth types of samples. The time between any first and second type of sample and any third and fourth type of sample is other than a multiple of a half cycle of the input signal. A first counter is used to count in response to the first or second types of samples and the second in response to the third or fourth types of samples in the same manner as in the single channel mixer. If the string of D flip-flops samples approximately equal number of first and second types of samples and approximately an equal number of third and fourth types of samples, DC offset in the two channel mixer is reduced.

19 Claims, 6 Drawing Sheets

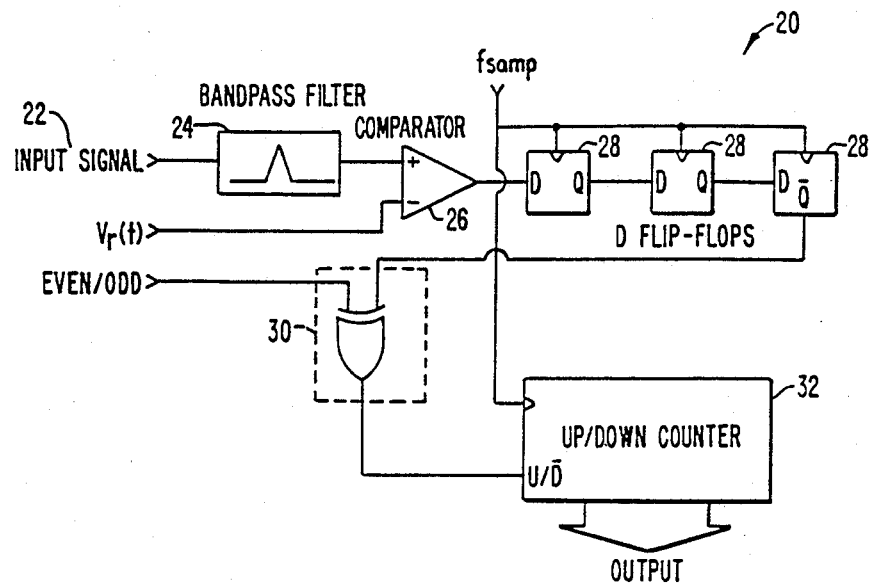
FIG.—1A.
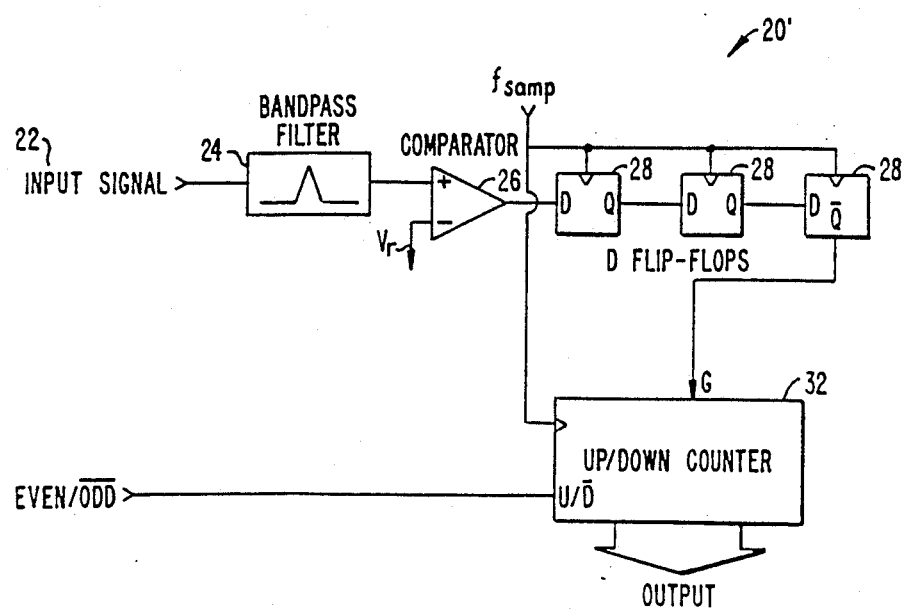
FIG.—1B.

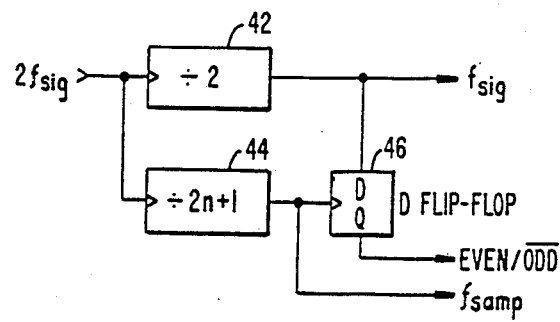
FIG._2.
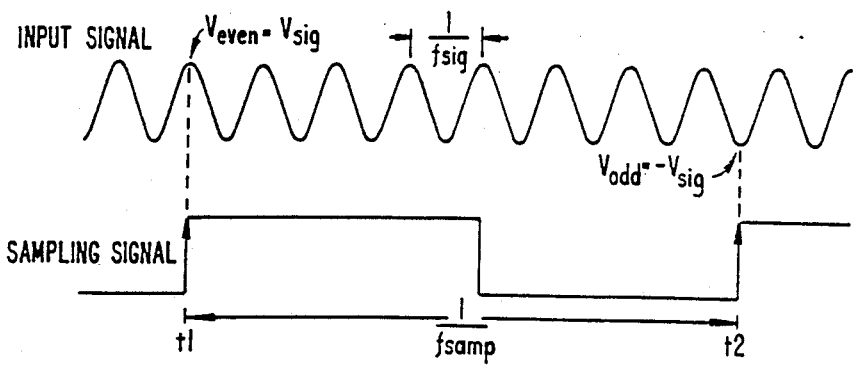
FIG._3.

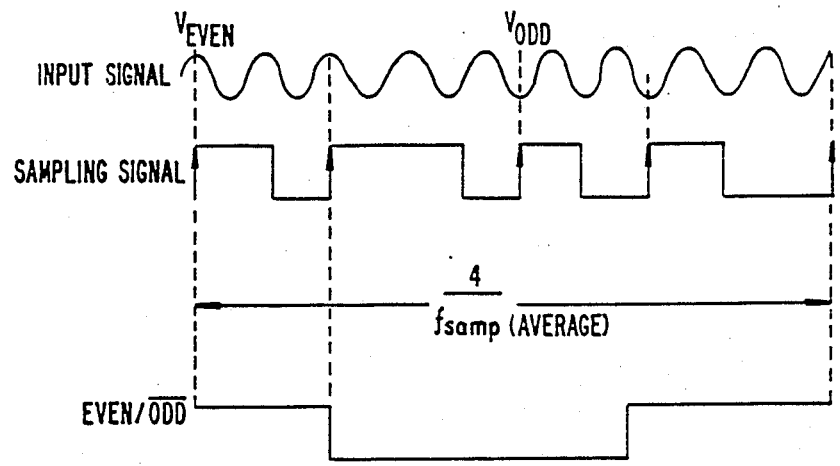
FIG._4.
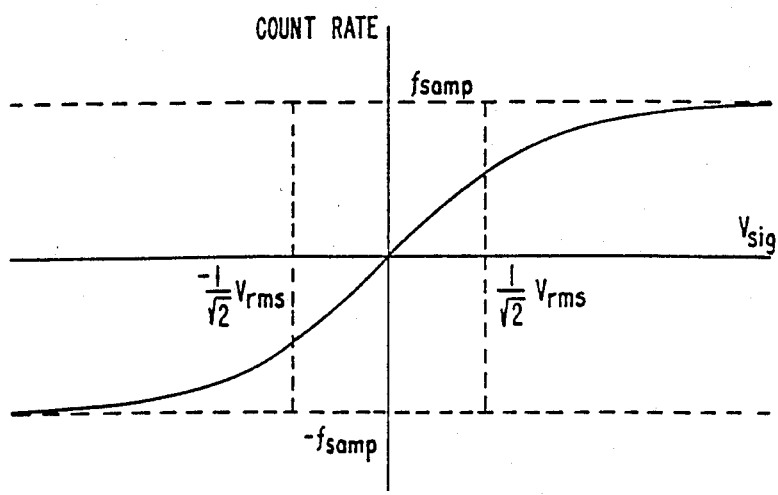
FIG._5.

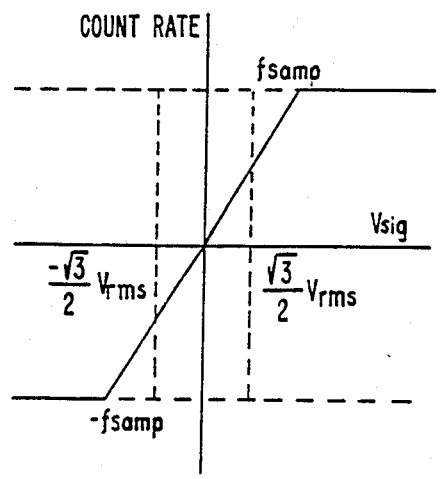
FIG._6.
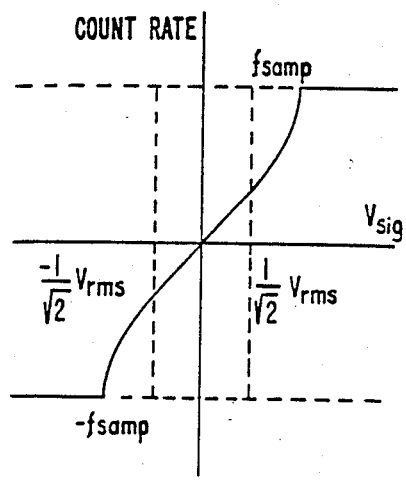
FIG._7.

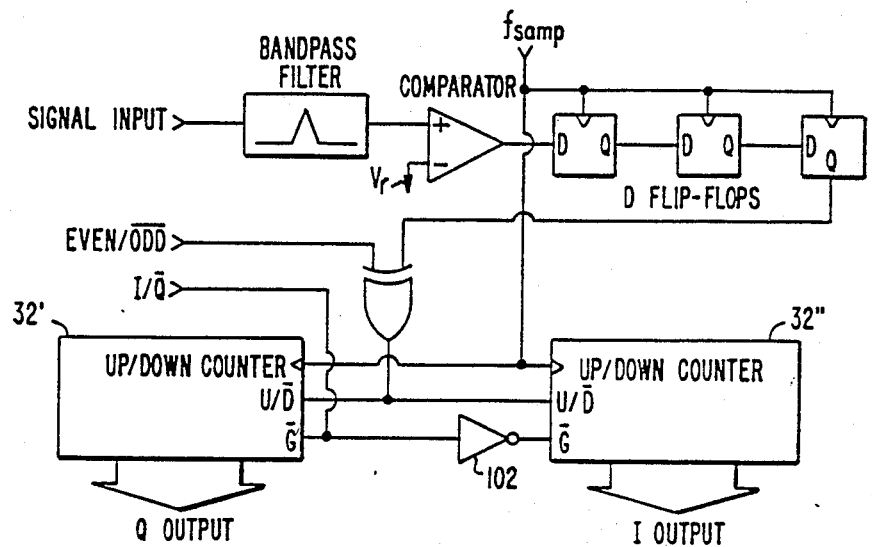
FIG._8.
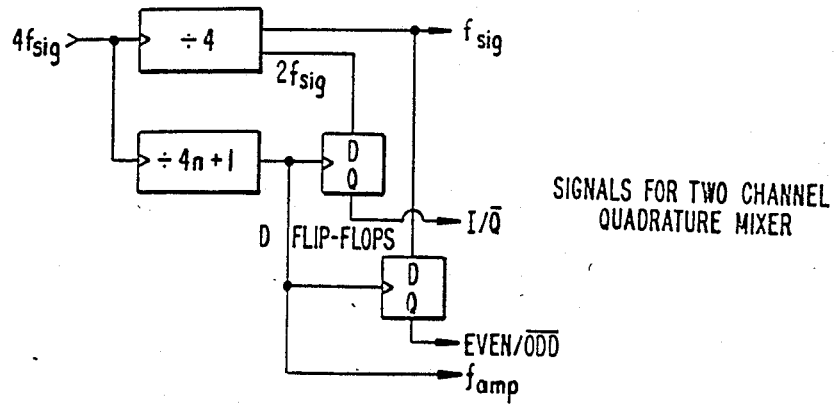
SIGNALS FOR TWO CHANNEL QUADRATURE MIXER
FIG._9.

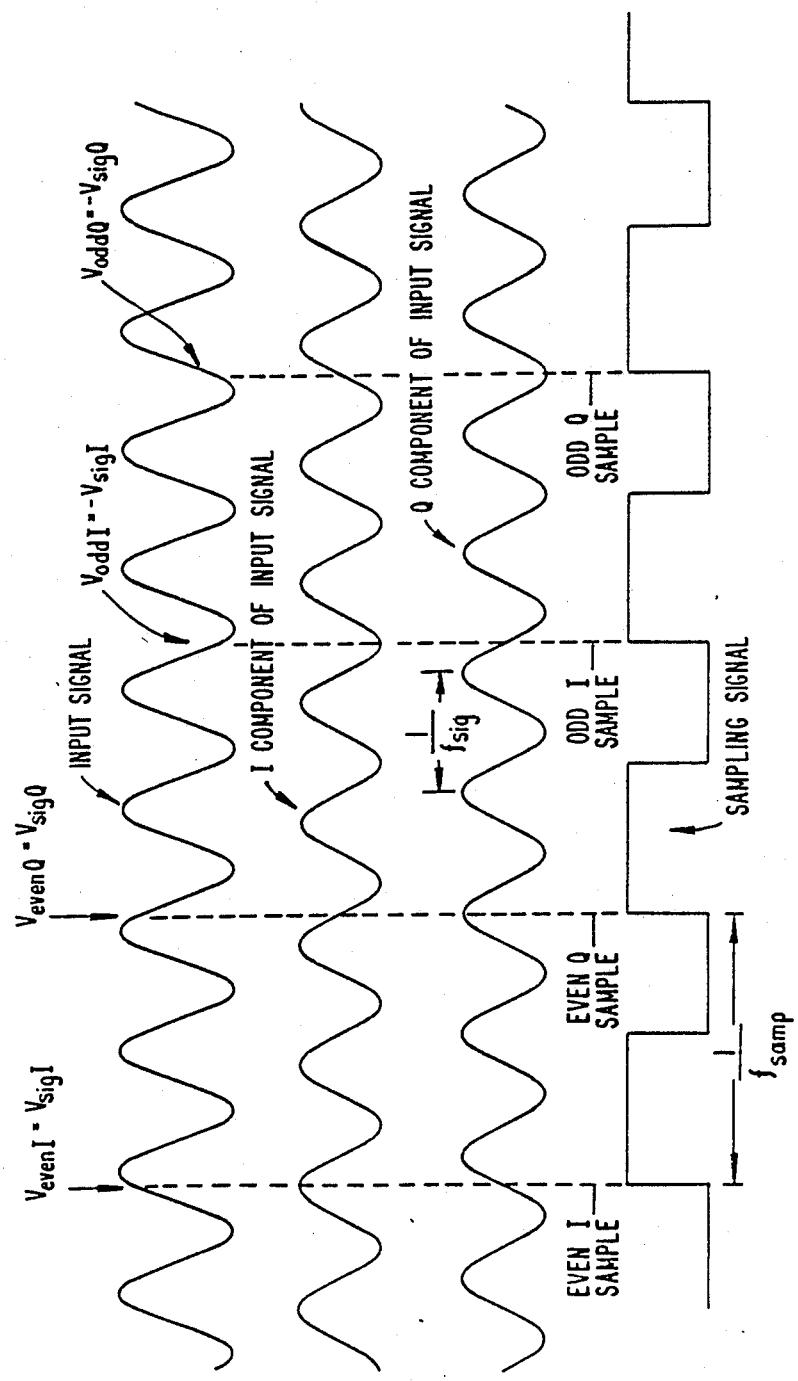
FIG._10.

DIGITAL INTEGRATING MIXER

CROSS-REFERENCED RELATED APPLICATION

This application is related to the application entitled "Improved Frequency Locking Device", also filed by applicant in the United States Patent and Trademark Office on Apr. 13, 1988 Ser. No. 07/181,129.

BACKGROUND OF THE INVENTION

In frequency modulation (FM) frequency locking techniques such as those described in the related application, a square law detector is used to measure the amount of amplitude modulation (AM) in an optical signal. For this purpose a double balanced mixer is used to extract a component of the detector signal at a particular frequency. The output of the mixer is nulled by servo loops to perform frequency locking. Any DC offset in the mixer will cause a corresponding closed loop frequency offset. For this reason very low DC offset is desirable. As described in the related application, FM frequency locking circuits may employ loop filters which include integrators. Any DC input offset in the first integrator of the loop filter will also cause a closed loop frequency offset. Hence, it is also desirable for a low offset mixer to have a "built-in" time integration for performing the function of the integrator in the loop filter in such frequency locking circuits. It is therefore desirable to provide a mixer having low DC offset as well as built-in time integration.

SUMMARY OF THE INVENTION

One aspect of the invention is directed towards a digital integrating mixer comprising a band pass filter for filtering an input signal and a comparator for comparing the filtered signal to a reference signal to provide an output. The output of the comparator assumes a first value when the filtered signal exceeds the reference signal and a second value when it does not. The mixer also comprises a sampling means including D flip-flop means for sampling the comparator output at predetermined times to provide a first and a second type of samples. The time interval between any two samples of the same type is an integral multiple of a cycle of the input signal. The time interval between any two samples of different types is different from an integral multiple of a cycle of the input signal. The mixer further comprises means responsive to the type and value of a sample for accumulating in an increasing or decreasing direction. The sampling means samples approximately an equal number of the first and second types of samples to reduce DC offset in the mixer.

Another aspect of the invention is directed towards a two-channel digital integrating mixer. Such mixer comprises a bandpass filter for filtering an input signal and a comparator for comparing the filtered signal to the reference signal to provide an output. The comparator output assumes a first value when the filtered signal exceeds the reference signal and a second value when it does not. The mixer comprises sampling means including D flip-flop means for sampling the comparator output at predetermined times to provide first, second, third and fourth types of samples. The time interval between two samples of the same type is an integral multiple of a cycle of the input signal. The time interval between any sample of the first type and any sample of the second type is different from an integral multiple of a cycle of the input signal. The time interval between any sample of the third type and any sample of the fourth is different from an integral multiple of a cycle of the input signal. The time interval between any first or second type of sample and any third or fourth type of sample is different from any multiple of half cycles of the input signals. The mixer further comprises a first means responsive to the type and value of a sample of the first or second type for accumulating in an increasing or decreasing direction. The sampling means samples approximately an equal number of the first and second types of samples to reduce the DC offset in the mixer. The mixer comprises yet a second means responsive to the type and value of a sample of the third or fourth type for accumulating in an increasing or decreasing direction. The sampling means samples approximately an equal number of the third and fourth types of samples to reduce the offset in the mixer.

BRIEF DESCRIPTION OF THE DRAWINGS

FIG. 1A is a schematic circuit diagram of a single channel digital integrating mixer to illustrate the preferred embodiment of the invention.

FIG. 1B is a schematic circuit diagram of a single channel digital integrating mixer to illustrate an alternative embodiment of the invention.

FIG. 2 is a schematic circuit diagram for generating a sampling signal and a signal for differentiating between different samples for use in the mixer of FIG. 1.

FIG. 3 is a graphical illustration of an input signal in comparison with the sampling signal to illustrate the preferred embodiment of the invention.

FIG. 4 is a graphical illustration of the signals in the mixer of FIG. 1 to illustrate the preferred embodiment of the invention.

FIGS. 5, 6 and 7 are graphical illustrations of the count rate plotted against the signal input of the mixer of FIG. 1 for different types of reference signals to illustrate the embodiment of FIG. 1.

FIG. 8 is a schematic circuit diagram of a two channel digital integrating mixer to illustrate another aspect of the invention.

FIG. 9 is a schematic circuit diagram of a circuit for generating the sampling signal and signals for differentiating between different types of samples used in the embodiment of FIG. 8.

FIG. 10 is a graphical illustration of the signals in the embodiment of FIG. 8 to illustrate the generation of different types of samples in the embodiment of FIG. 8.

The same components in the figures of this application are identified by the same numerals.

DETAILED DESCRIPTION OF THE INVENTION

FIG. 1A is a schematic circuit diagram of a digital integrating mixer 20 to illustrate the preferred embodiment of the invention. An input signal 22 is filtered by a bandpass filter 24. Input signal 22 may, for example, be an amplitude modulated carrier signal at a particular frequency. Mixer 20 then extracts a component of the input signal at such frequency to yield the amount of amplitude modulation. The bandwidth of the bandpass filter 24 is chosen to be on the order of half the sampling frequency so that the filter will effectively average the envelope of the input signal over the time between samples to reduce or eliminate any loss of signal to noise ratio due to the sampling. The filtered signal is then compared to a reference signal $V_r(t)$ by a comparator 26. The comparator output is sampled by a string of D flip-flops 28. The sampling by the flip-flops 28 is performed at a sampling frequency $f_{samp}$. The sampled signal is multiplied by an even/$\overline{odd}$ signal in circuit 30 to provide a control signal to counter 32. Operated also at the sampling frequency $f_{samp}$, counter 32 counts up when the signal from circuit 30 is of one value and counts down when the signal is of the other value. The output of counter 32 is the output of the digital integrating mixer 20.

The even/$\overline{odd}$ signal is generated by the circuit of FIG. 2. The component of the input signal to be extracted has the frequency $f_{sig}$. A signal at frequency $2f_{sig}$ is divided by 2 by circuit 42 to provide the signal $f_{sig}$. The signal at frequency $2f_{sig}$ is also divided by circuit 44 by an integer $(2n+1)$, where n is any positive integer, to provide the sampling signal at frequency $f_{samp}$. The signal at frequency $f_{sig}$ is fed to a D flip-flop 46 which is operated at frequency $f_{samp}$. The output of the flip-flop is the signal even/$\overline{odd}$.

In the preferred embodiment the sampling frequency $f_{samp}$ is chosen to be an odd half submultiple of the signal frequency $f_{sig}$, that is, $f_{samp}$ is equal to $2f_{sig}/(2n+1)$ where n is a positive integer. The relative phases of an input signal at frequency $f_{sig}$ and the sampling signal at an odd half submultiple of $f_{sig}$ are shown in FIG. 3. Relative phases of the two signals are chosen to maximize the samples sampled by the circuit of FIG. 1. As shown in FIG. 3, since each cycle of the sampling signal contains an odd integral multiple of a half cycle of the input signal, when one sample samples the input signal at its maximum, the next sample will sample the input signal at its minimum, as shown in FIG. 3. In the example of FIG. 3, $f_{samp}$ is $2f_{sig}/15$ so that n is 7.

The signal even/$\overline{odd}$ is a signal at a frequency of half of the sampling frequency. Hence if the sample at time t1 is a sample of the first type, the next sample at time t2 is a sample of the second type, whereupon the cycle repeats itself so that the next sample (not shown) will be the same as the sample at t1 and is again a sample of the first type. For convenience and description, the first type samples are termed even samples and samples of the second type, odd samples. Circuit 30 in the preferred embodiment is an exclusive OR gate whose inputs are the even/$\overline{odd}$ signal samples from the D flip-flops 28. If the input to the first D flip-flop changes close enough to the rising edge of the clocking signal, its output may be undefined for an unpredictable amount of time. A cascaded string of D-flip flops, in this case 3 flip-flops, is used to make the propagation of this type of event to the counter very unlikely.

While there is no loss of signal to noise ratio due to the sampling by choosing the bandwidth of the filter 24 to be on the order of half the sampling frequency, there is still a certain amount of noise present at the input. For convenience in calculating the response of circuit 20, this noise voltage is added to $V_r(t)$. Hence, $V_r(t)$ will have a statistical nature and a probability density $p(V)$ for being at a given voltage. The probability that the voltage V at the positive comparator input is greater than that at the referenced input is $P_g(V)$ and is equal to the integral of the probability density $p(V)$ from negative infinity to V. From FIG. 3, it will be noted that there is a difference in statistics between even and odd samples because of the odd half integral relationship between the signal and sampling frequencies. The even/$\overline{odd}$ signal tells the mixer whether a sample in the first D flip-flop is an even sample or an odd sample. For even samples, counter 32 counts up if the sampled comparator output is high, and down if it is low. For odd samples, the opposite is done; in other words, the counter counts down if the comparator output is high and up if it is low. The average rate at which counter 32 accumulates counts will be count rate = $\frac{1}{2}f_{samp}[(P_g(V_{even}) - (1 - P_g(V_{even}))) - (P_g(V_{odd}) - (1 - P_g(V_{odd})))] = f_{samp}(P_g(V_{even}) - P_g(V_{odd}))$, where $V_{even}$ and $V_{odd}$ are the voltages at the positive input to the comparator for even and odd samples respectively. If the input signal and the sampling signal are adjusted to have the proper relative phases, then $V_{even}$ is equal to $V_{sig} = -V_{odd}$ as shown in FIG. 3. The count rate then becomes $f_{samp}(P_g(V_{sig}) - P_g(-V_{sig}))$. The count rate is an odd function of $V_{sig}$ and hence is guaranteed to be zero when $V_{sig}$ is zero regardless of the functional form of $P_g(V)$. Therefore the mixer is offset free even if the voltage comparator has an offset, which would distort $P_g(V)$, or even including effects like violation of the set-up time of the D flip-flops 28. Such distortions will be the same for even and odd samples, in the absence of a signal, and therefore will cancel.

Mixer 20 has a built-in time integration because the output of counter 32 actually gives the time integral of the count rate.

FIG. 1B is a schematic circuit diagram of a digital integrating mixer illustrating an alternative embodiment of the invention. The mixer of FIG. 1B differs from that of FIG. 1A in that no exclusive OR gate is used. Instead the samples from the D flip-flops 28 enable counter 32 to count whereas in FIG. 1A, counter 32 is always enabled. The signal even/$\overline{odd}$ is fed directly to the counter in FIG. 1B to control the direction of accumulation. In other words, if the even/$\overline{odd}$ signal tells counter 32 that the sample from the D flip-flops is even, the counter will count up if the sampled comparator output is high, and will not count if it is low; for odd samples indicated by the even/$\overline{odd}$ signal, the counter will count down if the sampled comparator output is high, and will not count if it is low. The gain of mixer 20' has a gain which is half that of circuit 20 of FIG. 1A.

While the invention has been illustrated where the sampling frequency is chosen to be an odd half submultiple of the signal frequency, it will be understood that the invention is applicable where the sampling is performed non-uniformly instead of at a fixed frequency and the circuits of FIGS. 1A, 1B will function as before to give the integrated count rate while minimizing or even eliminating any DC offset.

FIG. 4 is a graphical illustration of the input signal, the sampling signal and even/$\overline{odd}$ signal to illustrate non-uniform sampling. As shown in FIG. 4, the sampling signal is such that it samples the comparator output at predetermined times to provide two even samples followed by two odd samples, where the even and odd samples are defined relative to the phase differences between them. Thus the samples are such that the time interval between any two samples of the same type is an integral multiple of a cycle of the input signal and the time interval between any odd sample and any even sample is different from an integral multiple of a cycle of the input signal. In reference to FIG. 4, the phase difference between the two even cycles and the two odd cycles are both equal to two cycles of the input signal. The time interval between the first occuring even sample and the first occuring odd sample is four and one-half cycles of the input signal and the time interval between the second occuring even sample and the second occuring odd sample is also four and one-half cycles of the input signal. Since the sampling is performed non-uniformly, strictly speaking there is no sampling frequency. However, if the pattern of sampling repeats itself within a certain time period, one can define an average sampling frequency. Hence if the pattern shown in FIG. 4 is repeated periodically, what is shown in FIG. 4 then consists of one complete sampling cycle.

While in the preferred embodiment a counter is employed, any accumulating means which responds to the type and value of a sample for accumulating in an increasing or decreasing direction may be used and is within the scope of the invention. As long as the sampling means samples approximately an equal number of even and odd types of samples, DC offset in the mixer 20 will be reduced.

As shown in FIG. 4, the even/odd signal may simply be 2 voltage levels which are produced so that at a predetermined time when an even sample is provided by the sampling means, one voltage level is produced; similarly, at a predetermined time when an odd sample is provided by the sampling means, the other voltage level is produced. When mixers 20, 20' of Figs. 1A, 1B are used for frequency locking circuits such as those described in the related application, the signal detected by the mixer will be nulled by the servo so that large dynamic range is not required. For such purposes, the reference signal $V_r(t)$ may simply be a constant voltage level.

In FIG. 5, the noise in the input signal is assumed to have a Gaussian probability density. As shown in FIG. 5, as long as the signal is small compared to the noise, the mixer response is quite linear. When the signal is not small compared to the noise in applications other than frequency locking circuits, it is desirable to provide mixers whose response remains linear when the signal is not small compared to the noise. This is accomplished by using reference signals $V_r(t)$ which are not simply a DC voltage level.

FIGS. 6, 7 are graphical illustrations of the count rate plotted against the signal input for reference signals of a saw tooth shape and that of a sine wave, respectively. As shown in FIGS. 6, 7, such reference signals greatly extend the linearity of the mixer so that the mixer can be used for large input signals as well.

FIG. 8 is a schematic circuit diagram of a two channel quadrature digital integrating mixer to illustrate another aspect of the invention. As is evident from a comparison of FIG. 8 to FIG. 1A, mixer 100 of FIG. 8 is similar in structure to mixer 20 of FIG. 1A except that in the mixer 100, there are two channels, I, Q, each of which is similar to that in mixer 20, and that the sampling frequency $f_{samp}$ is equal to $4f_{sig}/(4n+1)$ where n is a positive integer is chosen to be an odd quarter submultiple of the signal frequency $f_{sig}$. There are then four types of samples that occur in the sequence: even I, even Q, odd I, and odd Q. The sampling frequency can also be $4f_{sig}/(4n-1)$, where n is a positive integer. The sequence of the four types of samples will be Even I, Odd Q, Odd I, Even Q. The two channels, I, Q, are in quadrature. To identify a sample to be one of the four types, two inputs to each of the two counters 32', 32", will identify the sample as one of the four types.

FIG. 9 is a schematic circuit diagram for generating the even/odd and I/Q signals as well as the $F_{samp}$ signal. As shown in FIG. 8, the signal I/Q is applied to counter 32' and to counter 32" through inverter 102. Thus, when the signal I/Q identifies the sample from D flip-flops 28 as an I sample, one of the two counters 32', 32" is enabled and when the sample is identified as a Q signal, the other counter is enabled. The signal even/odd controls the counting up and counting down of the two counters in the same manner as that described above for the single channel mixer 20.

FIG. 10 is a graphical illustration of the function of mixer 100 of FIG. 8. Thus the input signal may be resolved into the two quadrature components I, Q as shown. As shown in FIG. 10, the first rising edge of the sampling signal as shown is matched with a maximum of the I component of the input signal. Such sample is identified as an even I signal. The next rising edge of the sampling signal samples a maximum of the Q component and is identified as an even Q signal. The next rising edge samples a minimum of the I component and gives the odd I sample. The fourth rising edge of the sampling signal shown in FIG. 10 samples the minimum of the Q component and is identified as an odd Q component. Thereafter the pattern repeats itself.

As in the case of the single channel mixer 20, mixer 100 can be used to perform non-uniform sampling of the input signal. Thus, mixer 100 may be used in which non-uniform sampling is performed as long as the following conditions are met:

1. The time interval between two samples of the same type is an integral multiple of cycle of the input signal.

2. The interval between any sample of the first type and any sample of the second type is different from an integral multiple of a cycle of the input signal.

3. The time interval between any sample of the third type and any sample of the fourth type is different from an integral multiple of a cycle of the input signal.

4. The time interval between any first or second type of sample and any third or fourth type of sample is other than a multiple of a half cycle of the input signal.

In other words, samples of the same type will bear the same phase relationship to the input signal. Samples of the first and third type will bear phase relationships to the input signal which are different from those of the second and fourth types respectively. The first and second types of samples must be distinct from the third and fourth types. For this reason the time interval between a first or second type of sample and any third of fourth type of sample must be different from an an integral multiple of half cycles (and therefore also of cycles) of the input signal. If not, the third and fourth types of samples will coincide with the first and second samples so that the two channels become degenerate.

Two accumulating means are used: one for accumulating in response to the type and value of the first or second types of samples in an increasing or decreasing direction, and the second accumulating means responsive to the type and value of the third or fourth type of samples in the same manner. The sampling means samples approximately an equal number of the first and second types of samples and samples approximately an equal number of the third and fourth types of samples so that DC offset in the mixer is reduced. As long as the above described conditions are met, DC offset is reduced in mixer 100 even though non-uniform sampling is performed.

As in the case of the single channel mixer, the range in which mixer 100 performs linearly may be extended by using a saw tooth or sine wave type of reference signal instead of a DC level.

The above described implementations are for illustrative purposes only so that variations in the details of implementation or method thereof may be within the scope of the appended claims.

Incorporated by reference into the specification are pages 52-61 (Chapter Five, Sections 1 and 2) of applicant's Ph.D dissertation "Optical to Radio and Radio to Optical Frequency Locking", submitted to the Department of Physics of Stanford University, dated Mar. 1988. These pages are attached hereto as Appendix A.

I claim:

1. A digital integrating mixer comprising:
    a bandpass filter for filtering an input signal;
    a comparator for comparing the filtered signal to a reference signal to provide an output, wherein said output assumes a first value when the filtered signal exceeds the reference signal and a second value when it does not;
    sampling means including D flip-flop means for sampling the comparator output at predetermined times to provide a first type and a second type of samples, wherein the time interval between any two samples of the first type or between any two samples of the second type is an integral multiple of the cycles of the input signal and wherein the time interval between any first type of sample and any second type of sample is different from an integral multiple of a cycle of the input signal; and
    means responsive to the type and value of a sample for accumulating in an increasing or decreasing direction, and wherein the sampling means samples approximately an equal number of the first and the second types of samples to reduce DC offset in the mixer.

2. The mixer of claim 1, wherein the accumulating means is such that when the sample is of the first type, the accumulating means will accumulate in an increasing direction when the sample is of the first value and in a decreasing direction when the sample is of the second value, and such that when the sample is of the second type, the accumulating means will accumulate in a decreasing direction when the sample is of the first value and in an increasing direction when the sample is of the second value.

3. The mixer of claim 2, sampling means having an output wherein the accumulating means comprises means for producing an output at first and second voltage levels, wherein at a predetermined time when a sample of the first type is provided by the sampling means, the first voltage level is produced and at a predetermined time when a sample of the second type is provided by the sampling means, the second voltage level is produced.

4. The mixer of claim 3, wherein the accumulating means comprises:
    an exclusive OR-gate receiving at its inputs the outputs of the producing means and sampling means.

5. The mixer of claim 4, said exclusive OR-gate having an output, wherein the accumulating means further comprises an up/down counter, and wherein said counter responds to the exclusive OR-gate output by counting up when the gate output is at one level and by counting down when the gate output is at the other level.

6. The mixer of claim 3, wherein the accumulating means comprises and up/down counter, and wherein said counter is enabled by only one of the two values of the samples, said counter responsive to the output of the producing means by counting up when the producing means output is at the first voltage level and by counting down when the producing means output is at the second voltage level.

7. The mixer of claim 1, wherein said sampling means performs sampling at a sampling frequency $f_{samp}$ which is an odd half submultiple of the input signal frequency, so that the samples from the sampling means alternates in time between the first and second types of 8. The mixer of claim 1, wherein the time samples interval between any first type of sample and any second type of sample is an odd integral number of half cycles of the input signal.

9. The mixer of claim 1, wherein the reference signal is a DC voltage level.

10. The mixer of claim 1, wherein the reference signal is a saw tooth type signal.

11. The mixer of claim 1, wherein the reference signal has the shape of a sinewave.

12. A digital integrating mixer comprising:
    a bandpass filter for filtering an input signal;
    a comparator for comparing the filtered signal to a reference signal to provide an output, wherein said output assumes a first value when the filtered signal exceeds the reference signal and a second value when it does not;
    sampling means including D flip-flop means for sampling the comparator output at predetermined times to provide a first, second, third and fourth types of samples, wherein (a) the time interval between two samples of the same type is an integral multiple of cycles of the input signal, (b) the time interval between any sample of the first type and any sample of the second type is different from an integral multiple of a cycle of the input signal, (c) the time interval between any sample of the third type and any sample of the fourth is different from an integral multiple of a cycle of the input signal and (d) the time interval between any first or second type of sample and any third or fourth type of sample is different from an integral multiple of a half cycle of the input signal;
    first means responsive to the type and value of a sample of the first or second type for accumulating in an increasing or decreasing direction, and wherein the sampling means samples approximately an equal number of the first and second types of samples to reduce DC offset in the mixer; and
    second means responsive to the type and value of a sample of the third or fourth type for accumulating in an increasing or decreasing direction, and wherein the sampling means samples approximately an equal number of the third and fourth types of samples to reduce DC offset in the mixer.

13. The mixer of claim 12, wherein the first accumulating means is such that when the sample is of the first type, the accumulating means will accumulate in an increasing direction when the sample is of the first value and in a decreasing direction when the sample is of the second value, and such that when the sample is of the second type, the accumulating means will accumulate in a decreasing direction when the sample is of the first value and in an increasing direction when the sample is of the second value.

14. The mixer of claim 13, wherein the second accumulating means is such that when the sample is of the third type, the accumulating means will accumulate in an increasing direction when the sample is of the first value and in a decreasing direction when the sample is of the second value, and such that when the sample is of the fourth type, the accumulating means will accumulate in a decreasing direction when the sample is of the first value and in an increasing direction when the sample is of the second value.

15. The mixer of claim 14, wherein said mixer further comprises means for differentiating first and third types of samples from second and fourth types of samples, and first and second types of samples from third and fourth types of samples, the differentiating means generating two outputs, wherein the first output is in a first state when the sample is of the first or third type, and in a second state when the sample is of the second or fourth type, wherein the second output is in a third state when the sample is of the first or second type and a fourth state when the sample is of the third or fourth type, wherein at a predetermined time when a sample of any type is provided by the sampling means, the two outputs are in states which together indicate the type of the sample wherein the first and second accumulating means accumulate in response to the two outputs of the differentiating means.

16. The mixer of claim 12, wherein said sampling means performs sampling at a sampling frequency $f_{samp}$ which is an odd quarter submultiple of the input signal frequency.

17. The mixer of claim 12, wherein the reference signal is a DC voltage level.

18. The mixer of claim 12, wherein the reference signal is a saw tooth type signal.

19. The mixer of claim 12, wherein the reference signal has the shape of a sinewave.

* * * * *

UNITED STATES PATENT AND TRADEMARK OFFICE
CERTIFICATE OF CORRECTION

PATENT NO. : 4,906,875

DATED : Mar. 6, 1990

INVENTOR(S) : Gregory M. Cutler

It is certified that error appears in the above-identified patent and that said Letters Patent is hereby corrected as shown below:

Column 8, line 13, "types of" should read -- types of samples.--

Column 8, line 14, "time samples interval" should read -- time interval --

Signed and Sealed this

Eleventh Day of June, 1991

Attest:

HARRY F. MANBECK, JR.

*Attesting Officer*  Commissioner of Patents and Trademarks